United States Patent
Augusto

(10) Patent No.: US 8,233,052 B2
(45) Date of Patent: Jul. 31, 2012

(54) IMAGING DEVICES OPERABLE WITH MULTIPLE ASPECT RATIOS

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 1307 days.

(21) Appl. No.: 11/570,610

(22) PCT Filed: Jun. 1, 2005

(86) PCT No.: PCT/EP2005/005866
§ 371 (c)(1),
(2), (4) Date: Dec. 14, 2006

(87) PCT Pub. No.: WO2005/125186
PCT Pub. Date: Dec. 29, 2005

(65) Prior Publication Data
US 2007/0188636 A1 Aug. 16, 2007

Related U.S. Application Data

(60) Provisional application No. 60/579,520, filed on Jun. 15, 2004.

(51) Int. Cl.
*H04N 9/04* (2006.01)
*H04N 5/222* (2006.01)
*H04N 5/225* (2006.01)
*H04N 5/335* (2006.01)

(52) U.S. Cl. ......... 348/207.99; 348/333.01; 348/333.02; 348/335; 348/294

(58) Field of Classification Search ............. 348/207.99, 348/207.2, 218.1, 335, 294, 302, 333.01, 348/362; 382/282, 312, 313
See application file for complete search history.

(56) References Cited

U.S. PATENT DOCUMENTS

| | | | | |
|---|---|---|---|---|
| 5,436,658 A | | 7/1995 | Onga | |
| 5,686,957 A | * | 11/1997 | Baker | 348/36 |
| 5,905,530 A | * | 5/1999 | Yokota et al. | 348/240.99 |
| 5,999,220 A | * | 12/1999 | Washino | 348/441 |
| 6,910,814 B2 | * | 6/2005 | Kawai et al. | 396/529 |
| 6,987,532 B1 | * | 1/2006 | Kawahara | 348/220.1 |
| 7,038,728 B2 | * | 5/2006 | Kim et al. | 348/445 |
| 7,054,552 B2 | * | 5/2006 | Konttinen | 396/435 |
| 7,136,099 B2 | * | 11/2006 | Tabata | 348/231.99 |
| 7,212,218 B2 | * | 5/2007 | Suzuki et al. | 345/660 |
| 7,262,799 B2 | * | 8/2007 | Suda | 348/280 |

(Continued)

FOREIGN PATENT DOCUMENTS

DE 3919149 12/1990

(Continued)

*Primary Examiner* — John Villecco
*Assistant Examiner* — Selam Gebriel
(74) *Attorney, Agent, or Firm* — Gavrilovich, Dodd & Lindsey, LLP; Charles D. Gavrilovich, Jr.

(57) ABSTRACT

Imaging devices including a novel imaging system wherein a 2-dimensional pixel array has a diagonal dimension larger than the diameter measurement of the image circle, thereby being capable of handling rectangular images with multiple aspect ratios. These new imaging devices can be used in various electronic imaging apparatus with or without a lens system.

24 Claims, 3 Drawing Sheets

U.S. PATENT DOCUMENTS

| | | | |
|---|---|---|---|
| 7,535,550 B2 * | 5/2009 | Nagasaka | 355/53 |
| 2001/0003493 A1 * | 6/2001 | Yoshikawa et al. | 359/686 |
| 2001/0043406 A1 * | 11/2001 | Mori | 359/694 |
| 2002/0089593 A1 * | 7/2002 | Tabata | 348/294 |
| 2002/0101531 A1 * | 8/2002 | Kaneda | 348/347 |
| 2003/0156212 A1 * | 8/2003 | Kingetsu et al. | 348/333.12 |
| 2005/0200743 A1 * | 9/2005 | Kawai et al. | 348/360 |
| 2006/0082657 A1 * | 4/2006 | Meier | 348/208.7 |
| 2006/0104627 A1 * | 5/2006 | Park | 396/234 |
| 2006/0176389 A1 * | 8/2006 | Kaneda | 348/335 |
| 2007/0058061 A1 * | 3/2007 | Nakayama et al. | 348/294 |

FOREIGN PATENT DOCUMENTS

JP   09163388   6/1997

* cited by examiner

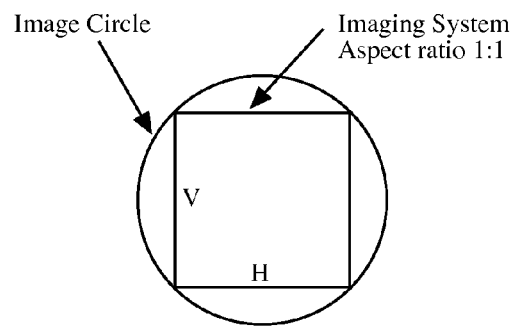
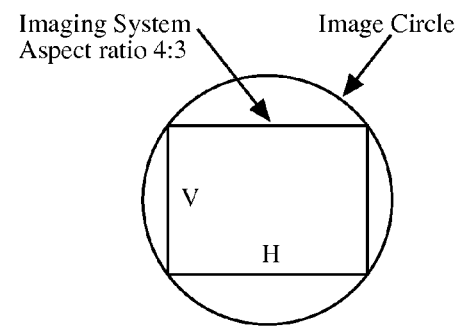
FIG. 1
Prior Art
FIG. 2
Prior Art
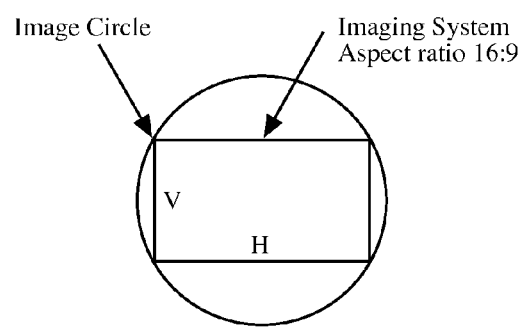
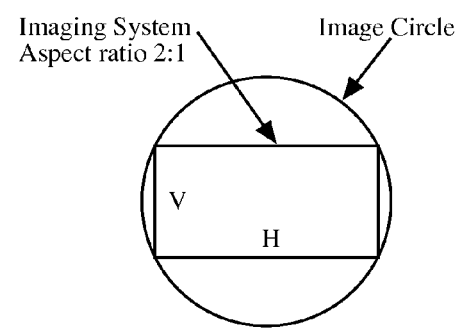
FIG. 3
Prior Art
FIG. 4
Prior Art

IMAGING DEVICES OPERABLE WITH MULTIPLE ASPECT RATIOS

RELATED PATENT APPLICATIONS

This application is a national stage application under 35 U.S.C. 371 of PCT/EP05/05866, titled "IMAGING DEVICES OPERABLE WITH MULTIPLE ASPECT RATIOS", filed Jun. 1, 2005, which claims priority to U.S. Provisional Application Ser. No. 60/579,520, filed Jun. 15, 2004, which are both incorporated by reference in their entirety, herein.

BACKGROUND OF THE INVENTION

The present invention relates to the design of electronic imaging devices and system, including electronic image capture and electronic image display. In particular it relates to the design of electronic sensor devices capable of capturing images of multiple formats or multiple aspect ratios of width over height. It also relates to the design of display devices, emissive or non-emissive, working in transmission or reflection modes, for direct view or for projection systems, capable of displaying images of different formats or multiple aspect ratios of width over height.

Examples of electronic sensors that the present invention relates to are Charge Coupled Devices (CCDs) and conventional CMOS image sensors (CIS), as well as to the new CMOS-based image sensors described in WO/02/33755. Examples of electronic displays that the present invention can be applied to, are Liquid Crystal Displays (LCDs), Plasma Displays, Organic Light Emitting Diodes (OLEDs), Liquid Crystals On Silicon (LCOS), Digital Micromirror Device (DMD), etc.

Conventionally, the size and aspect ratio of the imaging device (sensor or display) is fixed as a rectangle that is inscribed inside the image circle generated by a lens or group of lenses. The aspect ratio of that rectangle determines the aspect ratio of the acquired/displayed image. The diagonal of the rectangular imaging system matches the diameter of the image circle, regardless of the aspect ratio.

For the same image circle, and thus for diagonals with the same size, rectangles with different aspect ratios have different horizontal and vertical dimensions. For this reason, any rectangle inscribed in the image circle can only be optimized for one particular aspect ratio. For image handling with an aspect ratio other than the one of the imaging device (sensor or display), it is equivalent to having a rectangular image sensor whose diagonal is different than the diameter of the image circle. That results in the loss of areas of the full image circle as produced by the lens, that normally would not be lost with an imaging device with the desired aspect ratio.

Therefore, with conventional imaging devices, for images with different aspect ratios to be handled under optimal conditions, it is necessary to employ multiple imaging devices with the corresponding aspect ratios, otherwise, the results will be suboptimal.

The importance of this problem has been recognized in U.S. Pat. No. 6,307,683 (Oct. 23, 2001), which tries to solve the problem of multi-format image acquisition through increased complexity of a lens group. However, so far there has been no solution at the level of the imaging device (sensor or display) itself

SUMMARY OF THE INVENTION

It is an object of the present invention to provide an "Universal Imaging System" with which an imaging device is capable of handling images having different aspect ratios.

Another object of the invention is an image handling method, operating with the universal imaging system of the present invention, which at a later stage can produce images with arbitrary aspect ratios, as if they were optimized for every single different aspect ratio.

Yet another object of the invention is an image handling method, operating with the universal imaging system of the present invention, in which dynamic software control pre-defines the number of arbitrary aspect ratios to be simultaneously handled under optimal conditions. This image handling method requires only a subset of the amount data required by the method of the second object of the invention.

Another object of the present invention is to provide a rectangular "Multi-Format Imaging System", whose diagonal exceeds the diameter of the image circle, and that can handle images in a range of pre-defined aspect ratios. Any image with aspect ratio within that range will be handled as if the imaging system had been optimized for that particular aspect ratio.

Yet another object of the invention is an image handling method, operating with the multi-format imaging system of the present invention, in which dynamic software control pre-defines the aspect ratios to be simultaneously handled under optimal conditions.

BRIEF DESCRIPTION OF THE DRAWINGS

FIG. 1 (Prior Art) shows a rectangle, with a 1:1 aspect ratio, inscribed in a circle.

FIG. 2 (Prior Art) shows a rectangle, with a 4:3 aspect ratio, inscribed in a circle.

FIG. 3 (Prior Art) shows a rectangle, with a 16:9 aspect ratio, inscribed in a circle.

FIG. 4 (Prior Art) shows a rectangle, with a 2:1 aspect ratio, inscribed in a circle.

DETAILED DESCRIPTION OF THE INVENTION

Figure 5:
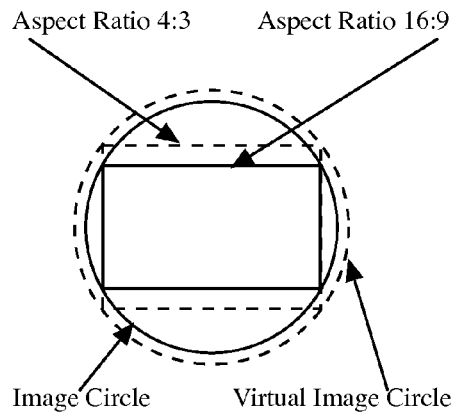
FIG. 5 illustrates a method for an imaging device with a 16:9 aspect ratio to handle an image with a 4:3 aspect ratio, according to which some horizontal rows, from the top and bottom edges of the 4:3 image, lay outside the image circle, resulting in a cropped image.

The present invention shows a completely new solution to the problem of imaging devices (sensors or displays) operable with multiple aspect ratios. The solution disclosed herein presents a methodology for the design of imaging devices (sensors or displays) that enable optimal operation of image handling (acquisition or display) for multiple aspect ratios, and for any size of the image circle produced by a lens. The new solution does not require special lenses.

Conventional imaging systems are shaped as rectangles to be inscribed inside the image circle of a by a lens or lens group. The diameter of the image circle determines the size of the diagonal of the imaging system, for all different aspect ratios, as it is shown in FIGS. 1, 2, 3, and 4 (Prior Art) for the 1:1, 4:3, 16:9, and 2:1 aspect ratios, respectively.

The following formulas show how to calculate the lateral dimensions of rectangles with different aspect ratios, inscribed inside a circle, as a function of the diameter of the circle. The circle is representative of the image circle produced by a lens or lens group, and the rectangles represent pixel matrices, in sensors or displays.

1. Lateral Dimensions of Rectangles with Different Aspect Ratios, Inscribed in a Circle In the formulas below, "L" represents a basic unit of length, "D" is the diameter of the image circle, "H" is the horizontal dimension, "V" is the vertical dimension, and "A" is the surface area, of the imaging system (sensor or display).

Rectangle with Aspect Ratio of 1:1, as shown in FIG. 1

$$D = \sqrt{(1 \times L)^2 + (1 \times L)^2} = \sqrt{2L^2} \rightarrow L = D/\sqrt{2}$$

$$H = 1 \times L = D/\sqrt{2}$$

$$V = 1 \times L = D/\sqrt{2}$$

$$A = H \times V = (D/\sqrt{2}) \times (D/\sqrt{2}) = D^2/2$$

Rectangle with Aspect Ratio of 4:3, as shown in FIG. 2

$$D = \sqrt{(4 \times L)^2 + (3 \times L)^2} = \sqrt{25L^2} = 5L \rightarrow L = D/5$$

$$H = 4 \times L = 4 \times D/5 = 0.8 \times D$$

$$V = 3 \times L = 3 \times D/5 = 0.6 \times D$$

$$A = H \times V = (4 \times D/5) \times (3 \times D/5) = D^2 \times 12/25 = 0.48 \times D^2$$

Rectangle with Aspect Ratio of 16:9, as shown in FIG. 3

$$D = \sqrt{(16 \times L)^2 + (9 \times L)^2} = L \times \sqrt{337} \rightarrow L = D/\sqrt{337}$$

$$H = 16 \times L = 16 \times D/\sqrt{337} = 0.8716 \times D$$

$$V = 9 \times L = 9 \times D/\sqrt{337} = 0.4903 \times D$$

$$A = H \times V = (16 \times D/\sqrt{337}) \times (9 \times D/\sqrt{337}) D^2 \times 144/337 = 0.382 \times D^2$$

Rectangle with Aspect Ratio of 2:1, as shown in FIG. 4

$$D = \sqrt{(2 \times L)^2 + (1 \times L)^2} = L \times \sqrt{5} \rightarrow L = D/\sqrt{5}$$

$$H = 2 \times L = 2 \times D/\sqrt{5} = 0.894 \times D$$

$$V = 1 \times L = 1 \times D/\sqrt{5} = 0.447 \times D$$

$$A = H \times V = (2 \times D/\sqrt{5}) \times (1 \times D/\sqrt{5}) = D^2 \times 2/5 = 0.4 \times D^2$$

2. Images and Imaging Systems with Different Aspect Ratios

Images can be converted from one aspect ratio to another, through methods that distort the original images to fit the targeted aspect ratio. Those methods are not considered here, because they introduce unacceptable geometric distortions.

There are two methods for an imaging system with a certain aspect ratio to handle images of a different aspect ratio. One method simply crops parts of the original image, while the other introduces vertical or horizontal unused regions ("black bars").

In the following, these two methods are exemplified for two formats of imaging systems and for two formats of images. The examples use the well known 4:3 and 16:9 aspect ratios, but the methods are applicable to any aspect ratio.

For a 16:9 Imaging System to Handle 4:3 Images:

According to the first method, match the horizontal dimensions of the original 4:3 image and of the 16:9 imaging system to H=16×L. With this solution, the vertical dimension is reduced from V(4/3)=12×L to V(16/9)=9×L, and some horizontal rows at the top and bottom of the original 4:3 image, have their left and right edges outside the image circle, and therefore are omitted in the 19:6 imaging system. The new 4:3 image has a diagonal that corresponds to a diameter of a larger image circle. The reduction in surface area and number of pixels from the original 4:3 image is given by: 9/12=0.75. Therefore, with this method, the handling of the original 4:3 image by the 16:9 imaging system requires the omission of 25% of the rows from the original 4:3 image. This case is shown in FIG. 5.

Figure 6:
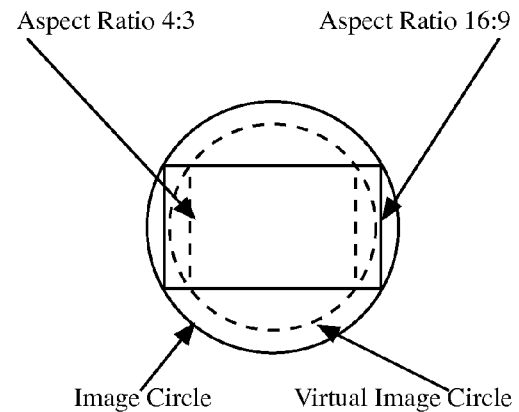
FIG. 6 illustrates a method for an imaging device with a 16:9 aspect ratio to handle an image with a 4:3 aspect ratio, according to which the entire 4:3 image is preserved, having a diagonal smaller than the image circle, resulting in unused (black) vertical columns added at the left and right of the 4:3 image.

According to the second method, match the vertical dimensions of the image in both formats to V=9×L. With this solution, black vertical columns are introduced, which appear on the sides of the original 4:3 image. The horizontal dimension of the actual image, not including the new black vertical columns, is reduced from H(16/9)=16×L to H(4/3)=12×L. The new 4:3 image has a diagonal that corresponds to a diameter of a smaller image circle. The reduction in surface area and number of pixels (excluding the new black vertical columns) from the original 4:3 image is given by: 12/16=0.75. Therefore, with this method, the handling of the original 4:3 image by the 16:9 imaging system results in a 25% reduction of the number of useful pixels. This case is shown in FIG. 6.

Figure 7:
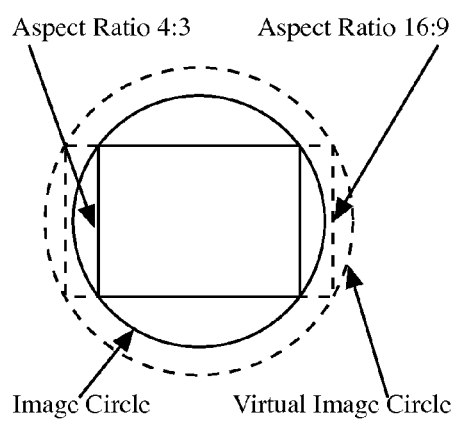
FIG. 7 illustrates a method for an imaging device with a 4:3 aspect ratio to handle an image with a 16:9 aspect ratio, according to which some vertical columns, from the left and right of edges the 16:9 image, lay outside the image circle, resulting in a cropped image.

For a 4:3 Imaging System to Handle 16:9 Images:

According to the first method, match the vertical dimensions of the image in both formats to V=9×L. With this solution, the horizontal dimension is reduced from H(16/9)=16×L to H(4/3)=12×L, and some vertical columns at the left and right of the 16:9 image have their top and bottom edges outside the image circle, and therefore are omitted in the 4:3 imaging system. The new 16:9 image has a diagonal that corresponds to a diameter of a larger image circle. The reduction in surface area and number of pixels from the 4:3 image is given by: 12/16=0.75. Therefore, with this method, the handling of the original 16:9 image by the 4:3 imaging system requires the omission of 25% of the columns from the original 16:9 image. This case is shown in FIG. 7.

Figure 8:
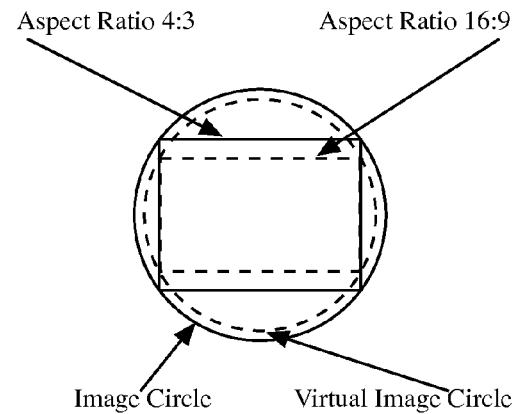
FIG. 8 illustrates a method for an imaging device with a 4:3 aspect ratio to handle an image with a 16:9 aspect ratio, according to which the entire 16:9 image is preserved, having a diagonal smaller than the image circle, resulting in unused (black) horizontal rows added at the top and bottom of the 16:9 image.

According to the second method, match the horizontal dimensions of the image in both formats to H=16×L. With this solution, black horizontal rows are introduced, which appear at the top and bottom of the original 16:9 image. The vertical dimension of the actual image, not including the new black vertical columns, is reduced from V(4/3)=12×L to V(16/9)=9×L. The new 16:9 image has a diagonal that corresponds to a diameter of a smaller image circle. The reduction in surface area and number of pixels (excluding the new black horizontal rows) from the 16:9 image is given by: 9/12=0.75. Therefore, with this method, the handling of the original 16:9 image by the 4:3 imaging system results in a 25% reduction of the number of useful pixels. This case is shown in FIG. 8.

The above statement shows that (as FIGS. 5, 6, 7, and 8 show,) with conventional designs of imaging systems, the handling of images with aspect ratios different from that of the imaging system, always produces suboptimal results for all the other aspect ratios.

Figure 9:
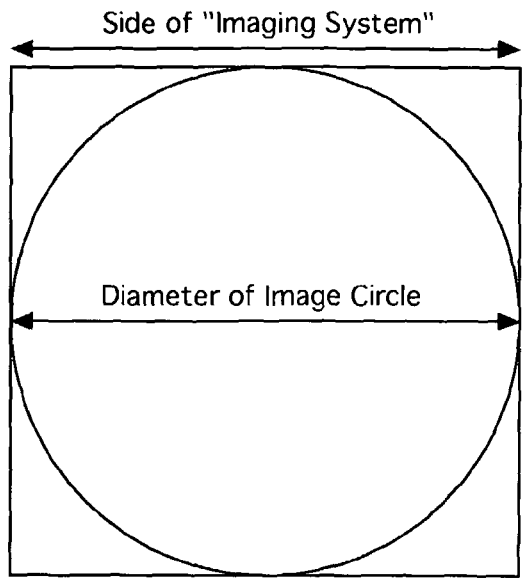
FIG. 9 shows an "Universal Imaging System", which is larger than entire image circle generated by a lens or lens group.

According to a first aspect of the present invention, there is provided a new imaging system that completely encloses the entire image circle generated by a lens or lens group, thereby providing an "Universal Imaging System". Typically such an imaging system will be a square shaped system whose sides have dimensions slightly larger than the diameter of the image circle to provide a misalignment tolerance between the imaging system and the lens, and still be sure that the entire image circle is enclosed by the imaging system. With this design it is the image circle that is inscribed inside the imaging system, rather than the reverse situation of conventional imaging systems, and therefore is capable of handling images with any and all aspect ratios. This case is shown in FIG. 9.

However, not all applications of imaging systems need to handle images of arbitrary aspect ratios. For example, for consumer electronics there are two main aspect ratios, the 4:3 and the 16:9, and possibly a third one, the 2:1, might become more relevant in the future. Therefore, according to a second aspect of this invention, there is provided a "multi-format" imaging system that can handle in an optimal manner a chosen range of aspect ratios, which are relevant for the application(s) in question.

While the "Universal Imaging System" provides maximum flexibility in terms of handling arbitrary aspect ratios, a "Multi-Format Imaging System" has the advantage of a much smaller area penalty, and therefore cost, over "Single Format Imaging Systems".

Figure 10:
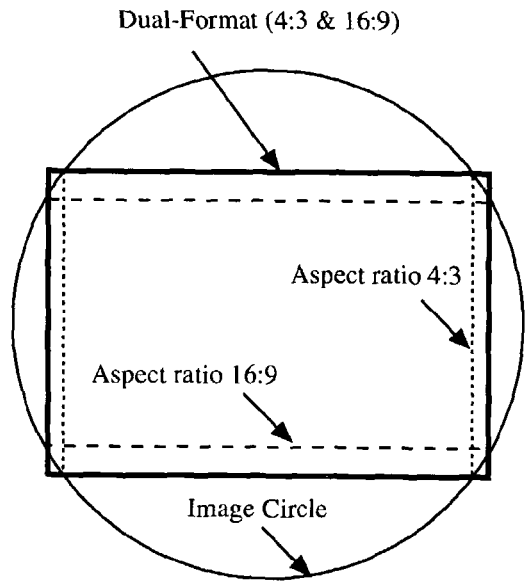
FIG. 10 shows a "Dual Format Imaging System" for the 4:3 and 16:9 aspect ratios.

Examples of multi-format imaging systems are described below. FIG. 10 shows a "Dual Format Imaging System" for the 4:3 and 16:9 aspect ratios. Such an imaging system is capable of optimized image handling for the two formats and can be designed with a very small area increase over an imaging system that would be designed for just one of those aspect ratios.

Such "Dual Format" imaging system is a rectangle whose vertical dimension is the largest of the vertical dimensions of the two aspect ratios, and whose horizontal dimension is the largest of the horizontal dimensions of the two aspect ratios.

Therefore, the "Dual Format" imaging system will have regions outside the image circle generated by the lens system. Defined as such, this imaging system is actually capable of handling not just those two aspect ratios, but all the aspect ratios that fall in the range between them: from 4:3 to 16:9.

Figure 11:
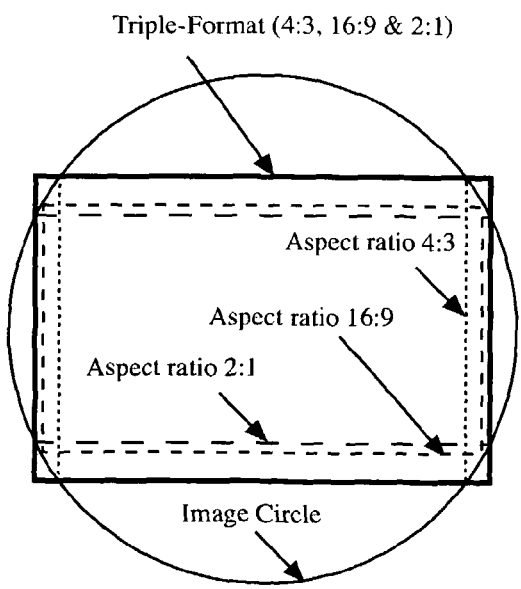
FIG. 11 shows a "Triple Format Imaging System" for the 4:3, 16:9, and 2:1 aspect ratios.

The data showing the lateral dimensions as a function of aspect ratio present earlier in this disclosure, allow the derivation of the ratio between the areas of a Dual Format and of a Single Format imaging systems. For example, the area of the Dual Format comprising the 4:3 and 16:9 formats, over the area of the Single Format (4:3) is: 1.09 (9% larger):
Area of "Single Format" (4:3): $A=0.48 \times D^2$
Area of "Dual Format" (4:3 & 16:9): $A=(0.8716 \times D) \times (0.6 \times D)=0.523 \times D^2$
Ratio of the areas: $R=0.523/0.48 \cong 1.09$ FIG. 11 shows a "Triple Format Imaging System" for the 4:3, 16:9, and 2:1 aspect ratios. Such an imaging system is capable of optimized image handling for the three formats and can be designed with a very small area increase over an imaging system that would be designed for just one of those aspect ratios.

Again, such "Triple Format" imaging system is a rectangle whose vertical dimension is the largest of the vertical dimensions of the three aspect ratios, and whose horizontal dimension is the largest of the horizontal dimensions of the three aspect ratios.

Therefore, the "Triple Format" imaging system will have regions outside the image circle generated by the lens system.

Again, defined as such, this imaging system is actually capable of handling not just those three aspect ratios, but all the aspect ratios that fall in the range between them: from 4:3 to 2:1.

The data showing the lateral dimensions as a function of aspect ratio present earlier in this disclosure, allow the derivation of the ratio between the areas of a Triple Format and of a Single Format imaging systems. For example, the area of the Triple Format comprising the 4:3, 16:9, and 2:1 formats, over the area of the Single Format (4:3) is: 1.12 (12% larger).
Area of "Single Format" (4:3): $A=0.48 \times D^2$
Area of "Triple Format" (4:3, 16:9, 2:1): $A=(0.894 \times D) \times (0.6 \times D)=0.536 \times D^2$
Ratio of the areas: $R=0.536/0.48 \cong 1.12$ 3. Image Formation with "Universal" and "Multi-Format" Imaging Systems With "Universal" and "Multi-Format" Imaging systems, there are several options for image formation, either image acquisition or image display, when the imaging system is a sensor or a display, respectively. The following describes those options. With both systems, the aspect ratio of the images can be chosen before or after the image formation.

When the aspect ratios chosen before image formation, the digital control of the imaging system is software-programmed for "windowing" with the chosen aspect ratio(s), that is, the only pixels to be utilized are those inside the chosen rectangle(s), thereby minimizing the bandwidth and the data handled during the image formation. It is also possible to dynamically define a different aspect ratio for each new frame. This possibility relies on "windowing", requires random access to pixels, and thus is not possible to film.

When the aspect ratio is chosen after image formation, all pixels from a universal imaging system are included in the image formation process, and therefore all aspect ratios can be handled. The selection of one or more aspect ratios can be made according to criteria other than limitations of the imaging system.

For still images the decision about the format could be made at the time of displaying or printing, and for video all the decisions could be made during the editing/production phase or when displaying. This method enables the aspect ratio of the video to be selected according to the capabilities and/or limitations of the displays available. This is not possible with film.

In case of a multi-format imaging system, all pixels from the imaging system that are included in the image formation process, allow the entire range of aspect ratios comprehended between the geometry with the largest aspect ratio (example 2:1) and the geometry with the smallest aspect ration (example 4:3), to be handled.

For still images the decision about the format could be made at the time of displaying or printing, and for video all the decisions could be made during the editing/production phase or when displaying. This method enables the aspect ratio of the video to be selected according to the capabilities and/or limitations of the displays available. This is not possible with film.

In the above disclosure, the issue of the aspect ratio of the imaging systems is always directly related to the image circle produced by a lens or group of lenses. Examples of imaging systems in which there is a direct relationship between the dimensions and aspect ratio of the imaging system and the image circle produced by the lens are image sensors in digital cameras and camcorders, as well as projection displays (for example made with LCOS or DMD technologies) for still images and video.

Direct view displays, such as CRTs, LCDs, Plasma, OLEDs, etc., are rectangular devices without lenses, and thus an image circle is only implied. However, the aspect ratio of these direct view displays is nonetheless indirectly tied to image circles, because the still images and/or video streams were tied to imaging devices that were directly related to image circles, such as the cameras that produced those images or video.

Therefore all the issues pertaining to the aspect ratios of imaging systems directly coupled to lenses, also apply to direct view (without lenses) imaging systems, such as conventional display technologies (CRT, LCD, Plasma, etc).

The invention claimed is:

1. An image capture device, comprising: an image sensor having a 2-dimensional pixel array capable of providing images from at least two of several rectangles defined on the image sensor,
the rectangles each having a first side that is perpendicular to a second side,
the first side of each rectangle being parallel to the first side of the other rectangles,
the second side of each rectangle being parallel to the second side of the other rectangles,
a ratio of a length of the first side to a length of the second side being different for each of the rectangles,
each of the rectangles having the first side longer than the second side; and
a lens configured to generate an image circle on the image sensor such that a perimeter of the image circle concurrently contacts each vertex of each one of the rectangles, wherein the 2-dimensional pixel array has a diagonal dimension larger than a diameter measurement of the image circle.

2. The image capture device of claim 1, wherein the 2-dimensional pixel array has a width and a length where the width and the length are both at least equal to a diameter of the image circle.

3. The image capture device of claim 2, further comprising digital control means arranged for pre-selecting image information data in a defined one of different image aspect ratios, determining which subset of pixels from the entire 2-dimensional pixel array are readout, and forwarding a selected image information to image formation means.

4. The image capture device of claim 3, wherein the digital control means is arranged to dynamically define a different image aspect ratio for each new image frame.

5. The image capture device of claim 2, further comprising digital control means arranged for readout and storage of information from all pixels of the 2-dimensional pixel array, comprising all possible image aspect ratios, and means for selecting image information data, in a defined one of several image aspect ratios, according to pre-defined criteria related to the particular capabilities of other image devices used to handle said image.

6. The image capture device of claim 1, wherein a first one of the several rectangles has the ratio of the length of the first side to the length of the second side being 16:9, and
a second one of the several rectangles has the ratio of the length of the first side to the length of the second side being 4:3.

7. The image capture device of claim 1, wherein a first one of the several rectangles has the ratio of the length of the first side to the length of the second side being 16:9, and
a second one of the several rectangles has the ratio of the length of the first side to the length of the second side being 4:3, and
a third one of the several rectangles has the ratio of the length of the first side to the length of the second side being 2:1.

8. The image capture device of claim 1, wherein the perimeter of the image circle crosses a perimeter of the image sensor at eight locations.

9. The image capture device of claim 1, wherein the entire image circle is located within the image sensor.

10. The image capture device of claim 1, wherein the image sensor has a first side with a length equal to the longest of the first sides and a second side with a length equal to the longest of the second sides.

11. The image capture device of claim 1, further comprising electronics that have software for selecting a ratio from the different ratios before formation of an image.

12. The image capture device of claim 11, wherein only pixels used in generating the image are pixels in the rectangle having the selected ratio.

13. The image capture device of claim 1, further comprising electronics that have software for selecting a ratio from the different ratios after formation of an image.

14. The image capture device of claim 13, wherein pixels used in generating the image include pixels outside of the rectangle having the selected ratio.

15. The image capture device of claim 1, further comprising:
a storage capable of storing images captured by the image sensor.

16. The image capture device of claim 1, wherein the 2-dimensional pixel array has a width and a length where at least one of the width and length is at least equal to a diameter of the image circle.

17. An image capture device, comprising:
an image sensor having a 2-dimensional pixel array capable of providing images from at least two of several rectangles defined on the image sensor, each rectangle having a length longer than a width and having a length to width ratio different from other rectangles of the several rectangles, the lengths of the rectangles being parallel; and
a lens configured to generate an image circle on the image sensor such that a perimeter of the image circle contacts each vertex of each one of the rectangles, wherein the 2-dimensional pixel array has a diagonal dimension larger than a diameter measurement of the image circle.

18. The image capture device of claim 17, wherein the 2-dimensional pixel array has an array width and an array length that are both at least equal to a diameter of the image circle.

19. The image capture device of claim 18, further comprising digital control means arranged for pre-selecting image information data in a defined one of different image aspect ratios, determining which subset of pixels from the entire 2-dimensional pixel array are readout, and forwarding selected image information to an image formation means.

20. The image capture device of claim 19, wherein the digital control means is arranged to dynamically define a different image aspect ratio for each new image frame.

21. The image capture device of claim 18, further comprising digital control means arranged for readout and storage of information from all pixels of the 2-dimensional pixel array, comprising all possible image aspect ratios, and means for selecting image information data, in a defined one of several image aspect ratios, according to pre-defined criteria related to the particular capabilities of other image devices used to handle said image.

22. The image capture device of claim 17, wherein a first one of the several rectangles has a first length to width ratio of 16:9, and
   a second one of the several rectangles has a second length to width ratio of 4:3.

23. The image capture device of claim 17, wherein a first one of the several rectangles has a first length to width ratio of 16:9, and
   a second one of the several rectangles has a second length to width ratio of 4:3, and
   a third one of the several rectangles has a third length to width ratio of 2:1.

24. The image capture device of claim 17, wherein the 2-dimensional pixel array has an array width and an array length where at least one of the array width and array length is at least equal to the diameter of the image circle.

* * * * *